United States Patent
Knödler

[11] Patent Number: 5,896,655
[45] Date of Patent: Apr. 27, 1999

[54] METHOD FOR MANUFACTURING ELECTRICALLY CONDUCTIVE LEAD-THROUGHS IN METALLIZED PLASTIC HOUSINGS

[75] Inventor: Dieter Knödler, Eschenbach, Germany

[73] Assignee: TEMIC TELEFUNKEN microelectronic GmbH, Heilbronn, Germany

[21] Appl. No.: 08/834,749

[22] Filed: Apr. 3, 1997

[30] Foreign Application Priority Data

Apr. 13, 1996 [DE] Germany ............ 196 14 706

[51] Int. Cl.⁶ .................................. H01R 43/00
[52] U.S. Cl. ................ 29/884; 29/878; 29/837; 29/845
[58] Field of Search ............ 29/884, 878, 837, 29/845

[56] References Cited

U.S. PATENT DOCUMENTS

| | | | |
|---|---|---|---|
| 3,744,129 | 7/1973 | Dewey, Jr. ............................... | 29/837 |
| 4,155,321 | 5/1979 | Tamburro ............................... | 29/837 X |
| 4,598,470 | 7/1986 | Dougherty, Jr. et al. ............... | 29/837 |
| 4,755,631 | 7/1988 | Churchwell et al. .................. | 29/840 X |
| 4,775,917 | 10/1988 | Eichhorn et al. ..................... | 29/840 X |
| 5,046,243 | 9/1991 | Walker .................................. | 29/878 |
| 5,098,864 | 3/1992 | Mahulikar ............................. | 29/837 |
| 5,102,829 | 4/1992 | Cohn ..................................... | 29/837 |
| 5,492,842 | 2/1996 | Eytcheson et al. .................... | 29/593 X |

FOREIGN PATENT DOCUMENTS

| | | |
|---|---|---|
| 0657960 | 6/1995 | European Pat. Off. . |
| 3313970 | 10/1984 | Germany . |
| 89 15 751 U | 5/1991 | Germany . |

OTHER PUBLICATIONS

H. Yumoto: "Feedthru assembly technique with reduced solder wick". In: Motorola Technical Developments, vol. 12, Apr. 1, 1991, p. 77.

*Primary Examiner*—Joseph J. Hail, III
*Assistant Examiner*—William Hong
*Attorney, Agent, or Firm*—Venable; George H. Spencer; Norman N. Kunitz

[57] ABSTRACT

A method for the manufacture of electrically conductive lead-throughs for metallized plastic housings. Elevations around the lead-through holes in the housing part are formed at the time of making the housing part (e.g. by injection molding). The entire surface of the housing part is then metallized and the metallization on the elevations around the lead-through holes is removed by mechanical processes that act in one plane and where the lower metallization areas remain unaffected on account of the difference in level. Finally, the metal pins are attached in the lead-through holes by soldering or glueing.

8 Claims, 2 Drawing Sheets

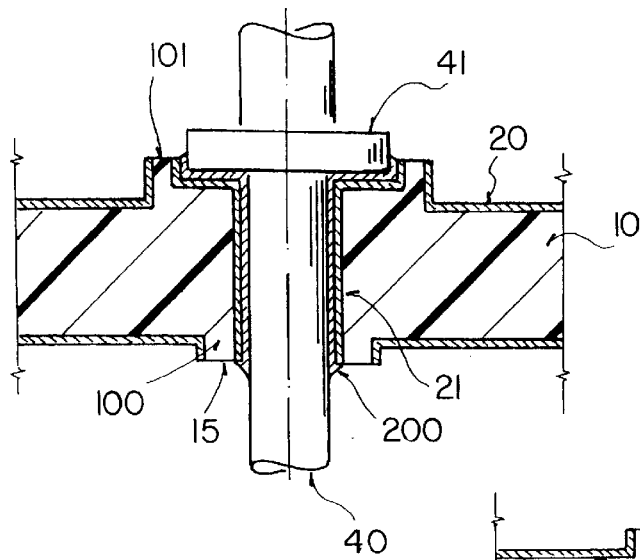
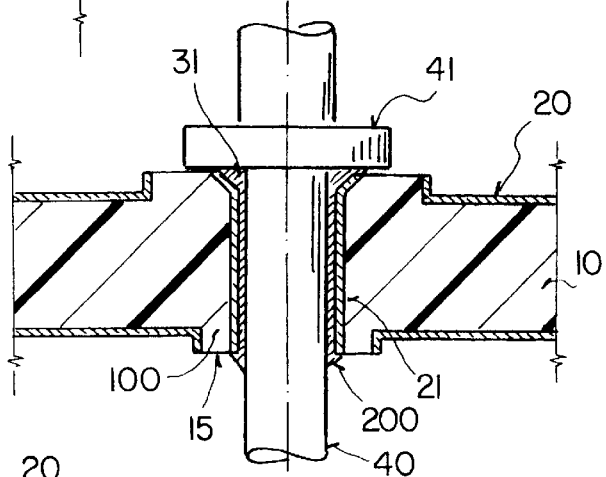
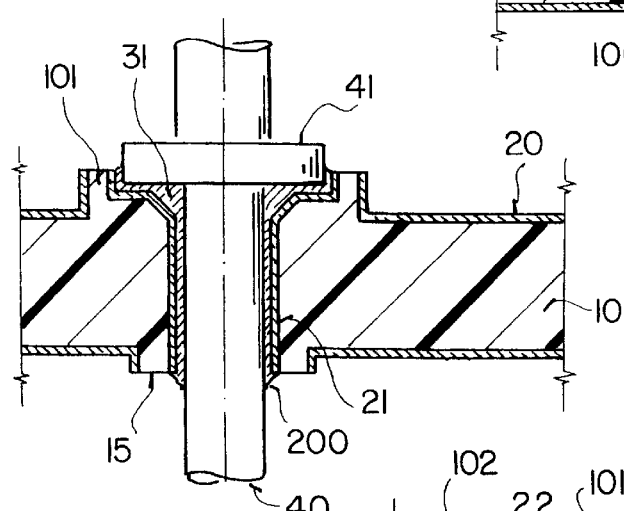
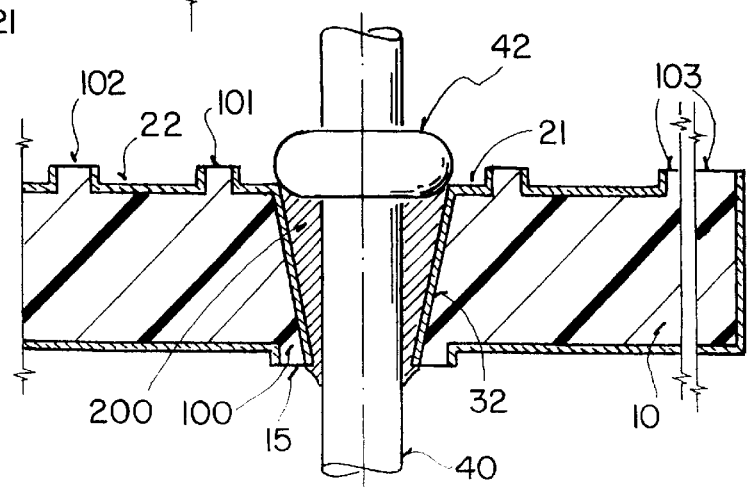

METHOD FOR MANUFACTURING ELECTRICALLY CONDUCTIVE LEAD-THROUGHS IN METALLIZED PLASTIC HOUSINGS

BACKGROUND OF THE INVENTION

The invention relates to a method for the manufacture of electrically conductive lead-throughs in metallized plastic housings for electronic applications.

Metallized plastic housings can be considered as an economical alternative to conventional metal housings for use in electronic and microelectronic applications. With the present state of the art, the manufacture of electrically conductive lead-throughs in metallized plastic housings is accomplished by various methods. One possibility is to press in simple metal pins or nailhead pins, or to insert the pins at the time of injection molding. A second possibility is to insert and solder or stick the pins in plastic housings already metallized. In both cases, however, it is necessary to insulate the pins with respect to the housing metallization in order to avoid electrical short-circuits. This is done by elaborate work operations such as masking at the time of applying metallization or by subsequent separation of the metallization layer around the lead-through holes or by sequential drilling or milling. In the case of pins that have been pressed in or integrally molded, there are problems in achieving the high degree of gas-tightness required for many applications. Another method provides for the soldering or sticking of relatively expensive glass-insulated metal pins in a manner similar to that for metal housings. Better gas-tightness is achieved in this way.

The object of the present invention is to specify a method for the manufacture of electrically conductive lead-throughs in metallized plastic housings in which the insulation of lead-through pins with respect to the housing metallization can be realized simply and at low cost. At the same time, gas-tightness and electromagnetic shielding is to be achieved.

SUMMARY OF THE INVENTION

This object, in a method for manufacturing electrically conductive lead-throughs in metallized plastic housings where metal pins are inserted and soldered or bonded in lead-through holes of at least one housing part, is solved by the following steps:

a) forming of elevations around the lead-through holes (30) in the housing part;
b) metallization over the entire surface of the housing part;
c) removal of the metallization on the elevations around the lead through holes by mechanical processes that act in one plane and where the lower metallization areas (20) remain unaffected on account of the difference in level; and
d) inserting and soldering or bonding the metal pins (40) in the lead-through holes.

It is advantageous if the elevations are formed at the time of manufacturing the housing parts.

In a first development of the invention, the elevations are formed as a circular shape around the holes, in a further development as an annular shape, and in a third development as a closed polygonal shape.

It is advantageous in the invention for the housing parts to have an elevated edge which is at the same level as the elevations around the lead-through holes. This allows the metallization there to be removed in the same operation together with the elevations.

In a further embodiment of the method in accordance with the invention, provision is made for forming further elevations enclosing specific surface areas in the housing part. This permits insulated conductive track structures to be created in the same process step together with the removal of the metallization of the elevations. These track structures are at a level which is lower than that of the residual metallization.

It is particularly advantageous for the method if the lead-through holes have an extension or a conical shape at at least one end.

BRIEF DESCRIPTION OF THE DRAWINGS

FIG. 2 Shows a cross-section through a housing part with inserted metal pin with a second development of the elevations.

FIG. 3 Shows a cross-section through a housing part with inserted metal pin with a third development of the elevations.

FIG. 4 Shows a cross-section through a housing part with inserted metal pin with a fourth development of the elevations.

FIG. 5 Shows a cross-section through a housing part with inserted metal pin with a fifth development of the elevations.

DESCRIPTION OF THE PREFERRED EMBODIMENTS

The invention will now be described on the basis of an embodiment example with reference to the Figures.

Figure 1A:
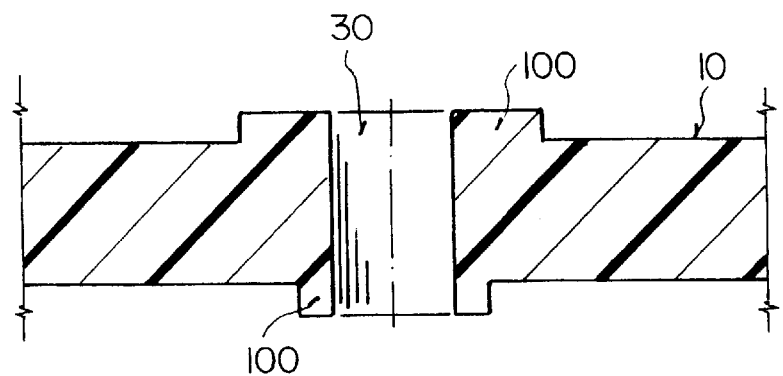
FIG. 1a Shows a cross-section through a housing part at a first point of time during the manufacturing process.

By means of a suitably designed tool, the holes 30 for the contact pins 40 are produced in one operation at the time of making the housing base 10 by an injection molding process, together with mainly circular elevations 100 or annular elevations 101 (see FIG. 2) of the base surface around the lead-through holes 30. A cross-section of the housing part after this process step is shown in FIG. 1a.

Figure 1B:
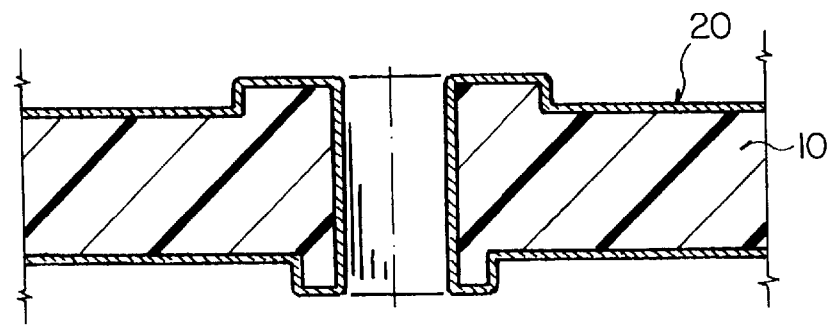
FIG. 1b Shows a cross-section through a housing part at a second point of time during the manufacturing process.
Figure 1C:
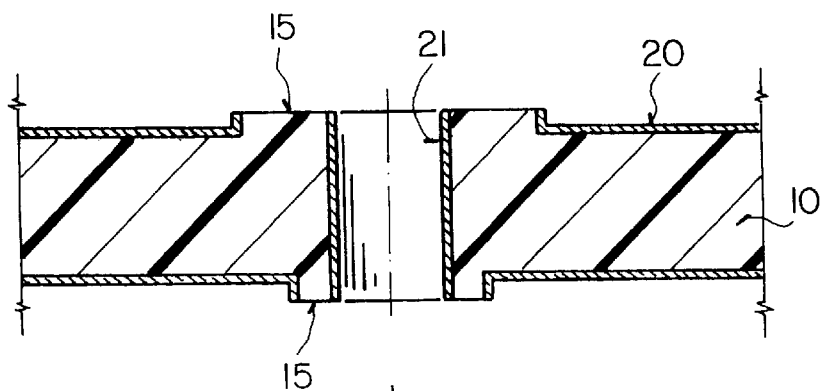
FIG. 1c Shows a cross-section through a housing part at a third point of time during the manufacturing process.
Figure 1D:
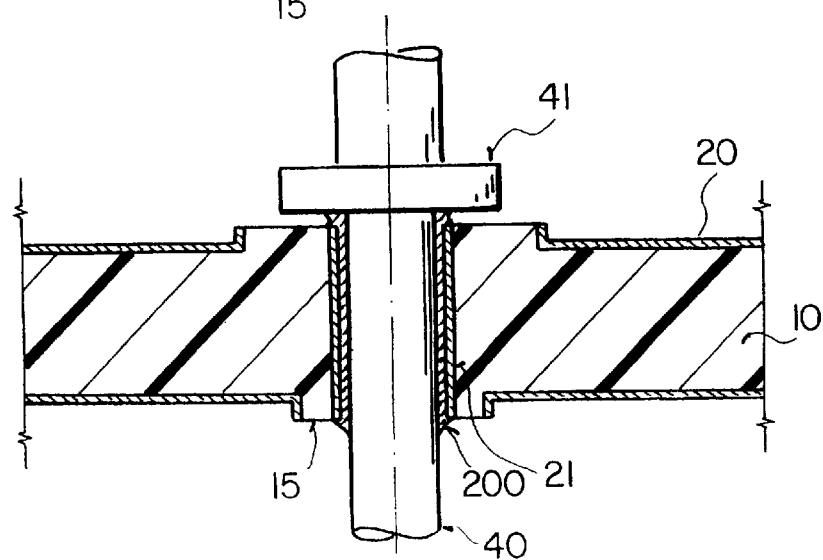
FIG. 1d Shows a cross-section through a housing part at a fourth point of time during the manufacturing process.

The part is then metallized 20 over the entire surface, i.e., without masking. The interior sides of the lead-through holes 30 are also metallized (FIG. 1b). In order to provide the necessary insulation 15 of the lead-through pins 40 that are to be inserted later, the metallization layer around the holes is now removed (FIG. 1c). Because of the elevations 100, 101 of the housing base around the holes 30, this working step can be performed at low cost without elaborate adjustment or masking and also in large series, e.g., by simply grinding off the metallization on the elevations 100, 101, without damaging the metallization 20 on the lower surfaces. It is a prerequisite for this process that the edge of the housing base remain below the level of the elevations for the insulation if the metallization is to be retained for closing the housing at a later time, e.g., by soldering. The lead through can now be completed by inserting a pin 40 of metal, preferably with ring 41 or bead 42 (FIG. 3) formed on it, and by soldering or bonding it (FIG. 1d). The solder or adhesive 200 provides a hermetic seal between lead-through metallization 21 and pin 40. It is not necessary to press in the pin. A ring 41 or bead 42 formed on the pin permits simple and accurate height positioning of the pin as well as good electromagnetic shielding.

Variants are possible in the form of an annular design of the insulating elevation 101 for better electromagnetic shielding or for soldering on of the contact pin over a larger area (FIG. 2), extensions 31 at the hole ends as solder/adhesive reservoir (FIG. 3), or a combination of these variations (FIG. 4). Making of the insulation 15 by removal of the metallization can in these cases be effected in the same way, e.g., by grinding. Furthermore, the lead-through hole can have a conical shape. Together with the pin bead, this leads to self-centering of the pin (FIG. 5).

In the event of later sealing the housing by plastic fusing, it might however also be required to remove the metallization at the edge 103 of the housing part. In this case, the edge 103 of the housing part must then be at the same level as the other surfaces 102 to be insulated (FIG. 5).

By insulating various metallization surfaces from each other in the manner described above, it is also possible for certain applications to create conductive track structures 22 where the tracks 22 are bounded by elevations 102 of the housing plastic material 10 (FIG. 5).

What is claimed is:

1. A method for manufacturing electrically conductive lead-throughs for metallized plastic housings where metal pins (40) are inserted and soldered or bonded in lead-through holes (30) of at least one housing part (10), said method including the following steps:

a) forming elevations (100, 101) around the lead-through holes (30) in the housing part (10);

b) forming a metallized layer (20) over the entire surface of the housing part (10);

c) removing the metallized layer on the (elevations (100, 101) around the lead-through holes (30) by mechanical processes that act in one plane and where the lower metallized layer areas (20) remain unaffected on account of the difference in level; and, d) inserting and bonding the metal pins (40) in the lead-through holes (30).

2. Method in accordance with claim 1, wherein the forming of the elevations (100, 101) takes place at the time of manufacturing the housing parts.

3. Method in accordance with claim 1 wherein the step of forming the elevations (100, 101) includes forming the elevations as a circular shape, as an annular shape, or as a closed polygonal shape around the holes (30).

4. Method in accordance with claim 1, wherein the housing part (10) has an elevated edge (103) and wherein the edge (103) of the housing part (10) is at the same level as the elevations (100, 101) around the lead-through holes (30), thus allowing the metallized layer at the edge to be removed in one operation together with the metallized layer on the elevations (100, 101).

5. Method in accordance with claim 1, wherein further comprising forming further elevations (102) enclosing specific surface areas in the housing part (10) allowing conductive track structures (22) that are insulated with respect to the residual metallization to be created at a lower level in the same process step of removing the metallization of the further elevations (102).

6. Method in accordance with claim 1, wherein the lead through holes (30) have an extension (31) at at least one end.

7. Method in accordance with claim 1, wherein the lead through holes (32) are of conical shape.

8. A method in accordance with claim 1 wherein the bonding step comprises soldering the metal pins (40) in the lead-through holes (30).

* * * * *